United States Patent
Park et al.

(10) Patent No.: US 11,327,838 B2
(45) Date of Patent: May 10, 2022

(54) MEMORY DEVICE HAVING ERROR CORRECTION FUNCTION AND OPERATING METHOD THEREOF

(71) Applicant: SAMSUNG ELECTRONICS CO., LTD., Suwon-si (KR)

(72) Inventors: Jung-Hwan Park, Hwaseong-si (KR); Tae-Young Oh, Seoul (KR); Hyung-Joon Chi, Suwon-si (KR); Kyung-Soo Ha, Hwaseong-si (KR); Hyong-Ryol Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 243 days.

(21) Appl. No.: 16/389,080

(22) Filed: Apr. 19, 2019

(65) Prior Publication Data

US 2019/0324854 A1 Oct. 24, 2019

(30) Foreign Application Priority Data

Apr. 20, 2018 (KR) .................. 10-2018-0046289

(51) Int. Cl.
*G06F 11/10* (2006.01)
*G11C 7/22* (2006.01)

(52) U.S. Cl.
CPC ...... *G06F 11/1076* (2013.01); *G06F 11/1048* (2013.01); *G11C 7/22* (2013.01)

(58) Field of Classification Search
CPC ............. G06F 11/1048; G06F 11/1076; G06F 11/1008; G11C 7/22; G11C 2029/0411; G11C 7/1009
See application file for complete search history.

(56) References Cited

U.S. PATENT DOCUMENTS 5,313,624 A * 5/1994 Harriman ............ G06F 11/1044
                                                    714/6.2
6,125,070 A    9/2000 Tomishima
                    (Continued)

FOREIGN PATENT DOCUMENTS

JP    11184761       7/1999
JP    2000-137651    5/2000
              (Continued)

OTHER PUBLICATIONS

Tae-Young Oh, "A 3.2 Gbps/pin 8 Gbit 1.0 V LPDDR4 SDRAM With Integrated ECC Engine for Sub-1 V DRAM Core Operation", Jan. 2015, IEEE Journal of Solid-State Circuits, vol. 50, No. 1, p. 178-190 (Year: 2015).*

*Primary Examiner* — Bryce P Bonzo
*Assistant Examiner* — Michael Xu
(74) *Attorney, Agent, or Firm* — F. Chau & Associates, LLC

(57) ABSTRACT

A memory device includes: a first memory bank and a second memory bank; a control logic configured to receive a command and control an internal operation of the memory device; and an error correction code (ECC) circuit configured to retain in a latch circuit first read data read from the first memory bank in response to a first masked write (MWR) command for the first memory bank based on a latch control signal from the control logic, generate a first parity from data in which the first read data retained in the latch circuit is merged with first write data corresponding to the first MWR command in response to a first write control signal received from the control logic, and control an ECC operation to retain in the latch circuit second read data read from the second memory bank based on the latch control signal.

20 Claims, 11 Drawing Sheets

(56) References Cited

U.S. PATENT DOCUMENTS

| | | | |
|---|---|---|---|
| 6,822,913 B2 | 11/2004 | Pochmuller | |
| 6,915,476 B2 | 7/2005 | Morino et al. | |
| 7,428,168 B2 | 9/2008 | Kim | |
| 7,738,311 B2 | 6/2010 | Youn et al. | |
| 8,947,952 B2* | 2/2015 | Kim | G11C 7/1051 365/189.15 |
| 9,411,392 B2 | 8/2016 | Bhatia et al. | |
| 9,607,667 B1* | 3/2017 | Lee | G11C 7/1069 |
| 2004/0095796 A1* | 5/2004 | Heightley | G11C 5/025 365/63 |
| 2005/0172177 A1 | 8/2005 | Oikawa | |
| 2008/0112251 A1 | 5/2008 | Youn et al. | |
| 2011/0103160 A1* | 5/2011 | Park | G11C 7/02 365/189.14 |
| 2011/0185261 A1* | 7/2011 | Toda | G06F 11/1068 714/763 |
| 2014/0063996 A1* | 3/2014 | Takahashi | G11C 7/22 365/200 |
| 2014/0317470 A1* | 10/2014 | Chung | G06F 11/1076 714/764 |
| 2016/0048424 A1* | 2/2016 | Sakai | G06F 11/1012 714/764 |
| 2016/0203045 A1* | 7/2016 | Suzuki | G11C 29/52 714/764 |
| 2017/0060789 A1* | 3/2017 | Noda | G06F 13/1673 |
| 2017/0083401 A1* | 3/2017 | Ryu | G06F 3/0619 |
| 2017/0139771 A1 | 5/2017 | Chung et al. | |
| 2017/0147434 A1* | 5/2017 | Bae | G06F 11/1048 |
| 2017/0308299 A1* | 10/2017 | Cha | H03M 13/13 |
| 2018/0074895 A1* | 3/2018 | Choi | G11C 29/52 |

FOREIGN PATENT DOCUMENTS

| | | |
|---|---|---|
| KR | 10-2006-0040395 | 5/2006 |
| KR | 10-2017-0032053 | 3/2017 |
| KR | 10-2017-0056823 | 5/2017 |

* cited by examiner

MEMORY DEVICE HAVING ERROR CORRECTION FUNCTION AND OPERATING METHOD THEREOF

CROSS-REFERENCE TO RELATED APPLICATION

This application claims priority under 35 U.S.C. § 119 to Korean Patent Application No. 10-2018-0046289, filed on Apr. 20, 2018 in the Korean Intellectual Property Office, the disclosure of which is incorporated by reference herein in its entirety.

TECHNICAL FIELD

Exemplary embodiments of the inventive concept relate to a memory device, and more particularly, to a memory device having an error correction function and an operating method thereof.

DISCUSSION OF RELATED ART

As technology advances, the capacity and speed of semiconductor memory devices continues to increase. Volatile memory devices are semiconductor memory devices that determine data by charges stored in capacitors therein, and when a power supply is interrupted, data stored therein is lost.

A process scale has been reduced to increase an integration degree of semiconductor memory devices. As the process scale has been reduced, a bit error rate has rapidly increased, which may be addressed by an error correction code (ECC).

SUMMARY

According to an exemplary embodiment of the inventive concept, a memory device includes: a memory cell array including a first memory bank and a second memory bank; a control logic configured to receive a command from the outside and control an internal operation of the memory device in response to the received command; and an error correction code (ECC) circuit configured to retain in a latch circuit a first read data read from the first memory bank in response to a first masked write (MWR) command for the first memory bank based on a latch control signal from the control logic, generate a first parity from data in which the first read data retained in the latch circuit is merged with first write data corresponding to the first MWR command in response to a first write control signal received from the control logic, and control an ECC operation to retain in the latch circuit second read data read from the second memory bank based on the latch control signal after the first parity has been generated.

According to an exemplary embodiment of the inventive concept, a memory device includes: a memory cell array including a first memory bank and a second memory bank; a control logic configured to receive a write command for the first memory bank and a read command for the second memory bank from the outside and control an internal operation of the memory device in response to the received write command and read command; and an error correction code (ECC) circuit configured to correct an error included in data. The ECC circuit includes: a syndrome generator configured to receive first read data read from the first memory bank and generate a syndrome indicating that there is an error in the first read data; a parity generator configured to generate a parity for first write data received from the control logic while the syndrome generator generates the syndrome for the first read data, and transmit the first write data and the parity for the received first write data to the second memory bank; and a syndrome decoder configured to correct an error included in the first read data by decoding the generated syndrome.

According to an exemplary embodiment of the inventive concept, an operating method of a memory device includes: receiving a first read data read from a first memory bank and retaining the first read data in response to a latch control signal received from a control logic; outputting the retained first read data in response to a first write control signal received from the control logic after the latch control signal is applied; generating a first parity from data in which the first read data output is merged with first write data corresponding to a first masked write (MWR) command in response to the first write control signal; and retaining second read data read from a second memory bank in response to the latch control signal.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
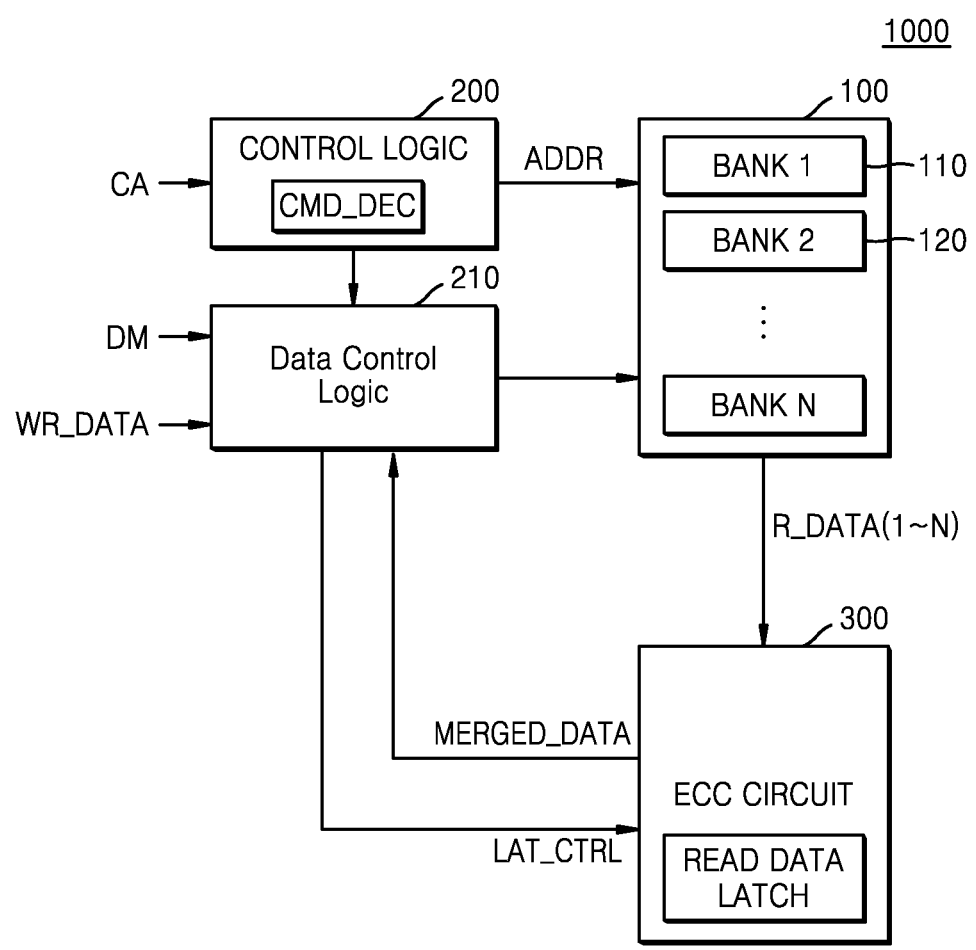
FIG. 1 is a block diagram illustrating a memory device according to an exemplary embodiment of the inventive concept.

Exemplary embodiments of the inventive concept provide a memory device in which a plurality of memory banks include circuits each having one error correction function, and an operating method of the memory device.

Hereinafter, exemplary embodiments of the inventive concept are described in detail with reference to the accompanying drawings. Like reference numerals may refer to like elements throughout this application.

FIG. 1 is a block diagram illustrating a memory device according to an exemplary embodiment of the inventive concept.

Referring to FIG. 1, a memory device 1000 may include a memory cell array 100, a control logic 200, a data control logic 210, and an error correction code (ECC) circuit 300.

The memory cell array 100 may include a plurality of memory cells provided as a matrix arranged in rows and columns. The memory cell array 100 may include a plurality of word lines and a plurality of bit lines connected to the memory cells. The plurality of word lines may be connected to rows of the memory cells, and the plurality of bit lines may be connected to columns of the memory cells. The memory cells of the memory cell array 100 may be dynamic random access memory (RAM) (DRAM) cells, static RAM (SRAM) cells, flash memory cells, phase change RAM (PRAM) cells, resistance RAM (ReRAM) cells, magnetoresistive RAM (MRAM) cells, or other types of memory cells. In this case, DRAM may include SDRAM and low power double data rate (LPDDR) RAM.

The memory cell array 100 may include typical circuits associated with the memory device 1000, such as row decoders, column decoders, and sense amplifiers. The row decoder may select any one of the plurality of word lines connected to the memory cell array 100. The row decoder may decode a row address received from the control logic 200 to select any one word line corresponding to the row address and then activate the selected word line.

A plurality of memory banks included in the memory cell array 100 may perform various memory operations such as read, write, or masked write. In addition, the plurality of memory banks may include respective sense amplifiers or may share one sense amplifier. In addition, the plurality of memory banks may include input/output lines for reading or writing data. For example, the plurality of memory banks may input and output data via a global input/output (GIO) line. On the other hand, the plurality of memory banks may share one ECC circuit 300.

The column decoder may select a certain bit line among the plurality of bit lines of the memory cell array 100. The column decoder may decode the column address received from the control logic 200 to select the certain bit line corresponding to the column address. The sense amplifier may be connected to the bit lines of the memory cell array 100.

The sense amplifier may sense a voltage change of the certain bit line among the plurality of bit lines, and amplify and output the sensed voltage change. When the memory cell array 100 includes the GIO line, data transmitted via the GIO line may be amplified by an input/output sense amplifier, and the amplified data may be output to the outside via data input/output pins. Alternatively, data output from the sense amplifier may be output to the ECC circuit 300.

The control logic 200 may receive command/address signals CA from an external device of the memory device 1000, for example, a central processing unit (CPU) or a memory controller. An active command, a read command, a write command, a free charge command, or the like may be issued by a combination of received command/address signals CA.

The control logic 200 may receive the command/address signals CA representing a masked write command MWR. The control logic 200 may decode the command/address signals CA corresponding to the masked write command MWR by using a command decoder CMD_DEC and control the memory device 1000 so that a masked write operation or a read-modify-write operation is performed. As an example, the control logic 200 may control an internal operation of the memory device 1000 by generating an internal command signal. Hereinafter, the read-modify-write operation may be collectively referred to as the masked write operation.

The control logic 200 may receive the command/address signals CA indicating addresses ADDR of the memory cells and the memory banks that are to be accessed in the memory cell array 100. The addresses ADDR may be provided to the memory cell array 100, and the data access operation of the memory cells addressed by the addresses ADDR may be performed.

A data access operation may be configured to store a plurality of data words in the memory cells of the address ADDR and read the stored data words. Each data word may include, for example, 128 data bits. As another example, each data word may include 32 data bits, 64 data bits, 256 data bits, 512 data bits, or the like.

The data word stored in the memory cell array 100 may have a soft data error or a hard data error. One or more data bits in the data word may be flipped at a time when the data word is stored in or read from the memory cell array 100, and a value of the data word may be changed. Alternatively, the memory cells in the memory cell array 100 may be damaged and an accurate storing and reading of one or more data bits may be hindered. Accordingly, it may be considered that the data word read in the memory cell array 100 may include such data errors.

To reduce such data errors, the memory device 1000 may include the ECC circuit 300 having the ECC to generate a parity containing one or more parity bits for the data word and store the generated parity in the memory cell array 100. The data output through the data access operation of the memory cell array 100 may be provided to the ECC circuit 300 as a word in which the parity is added to the data word.

The code word output from the memory cell array 100 to the ECC circuit 300 may be referred to as read data R_DATA associated with the masked write operation. The read data R_DATA may include main data and a parity for the main data. For example, the memory cell array 100 may output 136-bit read data R_DATA, the main data may include 128-bit data, and the parity may include 8-bit data.

The data control logic 210 may receive a data mask signal DM and write data WR_DATA from the external device. The data mask signal DM may indicate new bits (or bytes) to be updated among the received write data WR_DATA and previous bits to be retained in the read data R_DATA.

A bit of the write data WR_DATA corresponding to logic low of the data mask signal DM may be written in the memory cell array 100 as new data. A bit of the write data WR_DATA corresponding to logic high of the data mask signal DM may be masked and instead, may be retained as a bit of the main data corresponding to logic high of the data mask signal DM constituting the read data R_DATA. Hereinafter, for convenience of description, data output from a first memory bank 110 may be referred to as first read data R_DATA 1 and data output from a second memory bank 120 may be referred to as second read data R_DATA 2. Each read data R_DATA may include the main data indicating substantial data and parity for the substantial data. In addition, the main data may include first group data corresponding to the logic high of the data mask signal DM and second group data corresponding to the logic low of the data mask signal DM. The number of memory banks is only an example and may be two or more.

The second group data of the first read data R_DATA 1 may be written to the memory cell array 100 as bits of the first write data corresponding to the logic low of the data mask signal DM. In addition, the previous bits to be retained may be the first group data of the first read data R_DATA 1, which are bits corresponding to the logic high of the data mask signal DM. The first write data may indicate data that may be written in the first memory bank 110.

Similarly, assuming that the bits corresponding to the logic low of the data mask signal DM among the plurality of bits of the second read data R_DATA 2 are bits corresponding to the second group data of the second read data, the bits may be written in the memory cell array 100 as the bits of the second write data corresponding to the logic high of the data mask signal DM. In addition, the previous bits to be retained may be the first group data of the second read data R_DATA 2 that are bits corresponding to the logic high of the data mask signal DM. The first write data may indicate data that may be written in the first memory bank 110.

On the other hand, the first read data R_DATA 1 may include a first parity, and the second read data R_DATA 2 may include a second parity.

Accordingly, from a viewpoint of the masked write operation, the second group data may be data to be updated as the first write data, and the first group data may be the previous data to be retained as is.

Illustratively, main data of 128 bits may be applied to the memory device 1000. In the main data of 128 bits, the first group data of 8 bits may be retained as is, and the second group data of 120 bits may be updated to new data according to the masked write operation.

When the control logic 200 does not receive the masked write command from the external device, the ECC circuit 300 may generate a parity for the write data WR_DATA. In this case, the write data WR_DATA may be new data to be written in the memory cell array 100. The parity for the write data WR_DATA may be stored in the memory cell array 100 together with the write data WR_DATA. When data is read from the memory cell array 100, the ECC circuit 300 may decode the parity to detect and/or correct any error in the read data R_DATA or the parity.

When the control logic 200 receives the masked write command from the external device, the write data WR_DATA received from the external device may be combined with the read data R_DATA of a masked portion. In this case, since there may be one or more errors for the previous data before the write data WR_DATA and the previous data are combined, an error correction operation for the previous data may be required. In addition, a new parity may need to be generated for data in which the write data WR_DATA and the previous data are combined. In this case, the error correction operation for the previous parity may need to precede generation of the new parity.

The control logic 200 may receive the masked write command for each of the plurality of memory banks at a small time difference therebetween. In this case, a signal that combines the new data to data read from the memory bank may be generated after a holding time of the data read due to characteristics of the masked write operation. When the masked write operation is continuously performed for the first memory bank 110 and the second memory bank 120, an undesirable result may occur such that new data to be combined to the data read from the first memory bank 110 is written to the data read from the second memory bank 120.

Thus, the ECC circuit 300 may delay an output time of the first read data R_DATA 1 based on a latch control signal LAT_CTRL received from the control logic 200, so that the first write data to be written in the first memory bank 110 and data read from the first memory bank 110 may be merged, and an error correction may be performed.

In this case, the control logic 200 may control the data control logic 210 to transmit the latch control signal LAT_CTRL to the ECC circuit 300 or may directly transmit the latch control signal LAT_CTRL to the ECC circuit 300.

Thereafter, the data control logic 210 may receive merged data MERGED_DATA from the ECC circuit 300 in which the masked write operation and the error correction have been performed, and may write the received merged data MERGED_DATA in the memory cell array 100.

Figure 2:
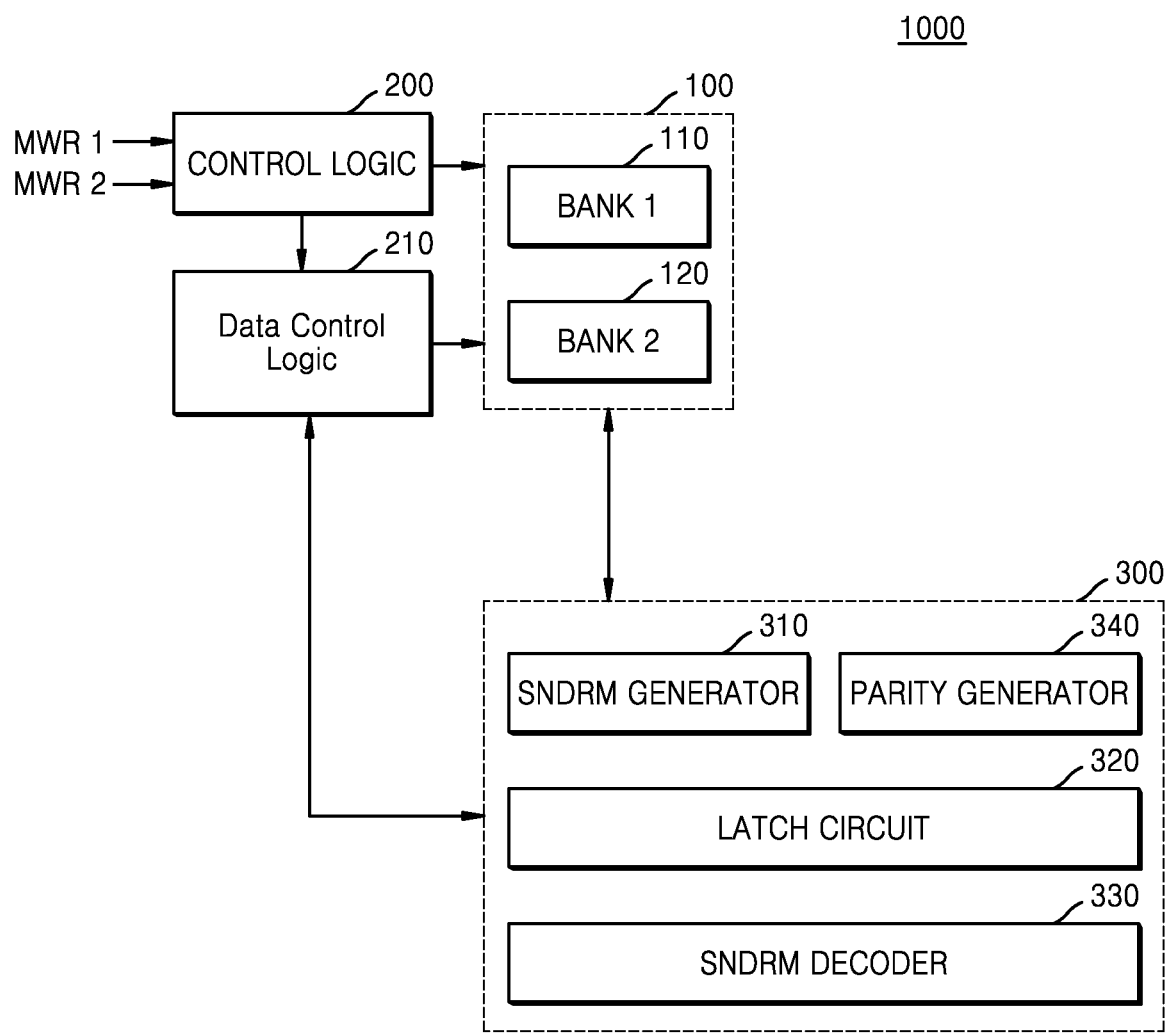
FIG. 2 is a detailed block diagram illustrating the memory device of FIG. 1 according to an exemplary embodiment of the inventive concept.

FIG. 2 is a detailed block diagram illustrating the memory device of FIG. 1 according to an exemplary embodiment of the inventive concept.

Referring to FIG. 2, the memory cell array 100 may include the first memory bank 110 and the second memory bank 120.

The first memory bank 110 and the second memory bank 120 may share one ECC circuit 300. In other words, operations including syndrome generation, syndrome decoding, and parity generation may be performed to correct errors of data included in the first memory bank 110 and data included in the second memory bank 120.

The ECC circuit 300 may include a syndrome generator 310, a latch circuit 320, a syndrome decoder 330, and a parity generator 340. The ECC circuit 300 may perform various types of ECC encoding and ECC decoding operations to detect errors and correct the errors. As an example, the ECC circuit 300 may use a parity-check, a cyclic redundancy code check (CRCC), a checksum check, or the Hamming code. In addition, the ECC circuit 300 may use a correction technique such as x4 single device data correction (x4 SDDC), x8 single-bit error correction and double-bit error detection (SECDED), or lockstep x8 SDDC to correct errors of a plurality of memory chips.

According to an exemplary embodiment of the inventive concept, the ECC circuit 300 may continuously receive the first read data R_DATA 1 included in the first memory bank 110 and the second read data R_DATA 2 included in the second memory bank 120, and may retain the first read data R_DATA 1 and the second read data R_DATA 2 based on the latch control signal LAT_CTRL.

Thereafter, the ECC circuit 300 may generate the first parity for data that has merged the first read data R_DATA 1 that has been retained in the latch circuit 320 with the first write data based on a first write control signal received from the control logic 200, and may generate the second parity for data that has merged the second read data that has been retained in the latch circuit 320 with the second write data based on a second write control signal received from the control logic 200.

The syndrome generator 310 may generate a syndrome indicating that there are one or more errors in the read data R_DATA received from the memory cell array 100. For convenience of description, it is assumed that the 136-bit read data R_DATA output from the memory cell array 100 includes 128-bit main data and an 8-bit parity for the 128-bit main data. In this case, the syndrome generator 310 may generate an 8-bit syndrome for the 128-bit main data.

The latch circuit 320 may delay an output time point (a time at which data is output from the latch circuit 320 to the syndrome decoder 330) of data received from the memory cell array 100 for a certain time based on the latch control signal LAT_CTRL.

When the latch control signal LAT_CTRL is applied, the latch circuit 320 may retain the first read data R_DATA 1, and when the first write control signal is applied, the latch circuit 320 may output the first read data R_DATA 1 that has been retained in the latch circuit 320 to the syndrome decoder 330. In addition, when the latch control signal LATCH CONTRL is sequentially applied, the latch circuit 320 may retain the second read data R_DATA 2, and when the second write control signal is applied, the latch circuit 320 may output the second read data R_DATA 2 that has been retained in the latch circuit 320 to the syndrome decoder 330.

In this case, data for which the parity generator 340 generates a parity may be data that has been output from the latch circuit 320 and has been processed through the syndrome decoding operation and the error correction operation. Accordingly, the latch circuit 320 may output data after delaying for a certain time, so that the parity generator 340 may generate a parity for correct data.

The syndrome decoder 330 may correct an error of the main data by using a decoding signal. As a result of correcting the error of the main data, the corrected main data may be output to the outside of the memory device 1000 to perform the read operation, or may be output to the parity generator 340 to perform the masked write operation.

The parity generator 340 may generate a parity for received data. In this case, the parity generator 340 may receive the write data WR_DATA from the outside of the memory device 1000 via the data control logic 210. In addition, the parity generator 340 may receive error-corrected read data R_DATA from the syndrome decoder 330. Accordingly, the parity generator 340 may generate the parity for the write data WR_DATA, or may generate a parity by merging the write data WR_DATA with the corrected read data R_DATA to correspond to the data mask signal DM.

According to an exemplary embodiment of the inventive concept, after the syndrome decoder 330 corrects the errors based on the syndrome included in the first read data R_DATA 1 and the second read data R_DATA 2, the parity generator 340 may generate the first parity and the second parity. In this case, the first read data R_DATA 1 and the second read data R_DATA 2 may include data sequentially output from the first memory bank 110 and the second memory bank 120, and syndromes of the data, respectively.

In addition, the write data WR_DATA may include the corrected main data received from the syndrome decoder 330. In this case, the parity generator 340 may generate the parity for the corrected main data and write the corrected main data and the generated parity in the memory cell array 100.

The control logic 200 may transmit the first read data R_DATA 1 read from the first memory bank 110 and the second read data R_DATA 2 read from the second memory bank 120 to the ECC circuit 300.

The control logic 200 may receive the read command or the masked write command for the first memory bank 110 and the second memory bank 120 by using a combination of the command/address signals CA received from the external device of the memory device 1000. The read command and the masked write command may include the addresses ADDR of the first memory bank 110 and the second memory bank 120. Accordingly, the read command may include a read command for the first memory bank 110 and a read command for the second memory bank 120, and the same may be applied to the masked write command.

In this case, the control logic 200 may control the memory cell array 100 to output the data included in the first memory bank 110 and the second memory bank 120 to the ECC circuit 300 via the input/output (GIO) line and an input/output sense amplifier.

When the control logic 200 receives the read command, the ECC circuit 300 may perform the error correction operations including the syndrome generation and the syndrome decoding to detect errors occurring in a process of reading data included in the first memory bank 110 and the second memory bank 120.

Similarly, when the control logic 200 receives the masked write command, the ECC circuit 300 may perform the read operation belonging to the read-modify-write operation on the data included in the first memory bank 110 and the second memory bank 120, and may perform the error correction operation including the syndrome generation and the syndrome decoding to detect the errors occurring in the process of reading the data.

The control logic 200 may receive the write command or the masked write command for the first memory bank 110 and the second memory bank 120 by using a combination of the command/address signals CA received from the external device of the memory device 1000. In addition, the control logic 200 may receive the write data WR_DATA for a memory bank having the corresponding address ADDR together with the command/address signals CA.

When the control logic 200 receives the write command, the control logic 200 may transmit a write control signal with the write data WR_DATA to the parity generator 340. Accordingly, the parity generator 340 may generate the parity for the received write data WR_DATA, and may write via the data control logic 210 the write data WR_DATA and the parity for the write data WR_DATA in the memory bank having the corresponding address ADDR, based on the address ADDR of the memory bank included in the write control signal.

When the control logic 200 receives the masked write command, the control logic 200 may transmit to the parity generator 340 the write control signal generated based on the data mask signal, together with the write data WR_DATA. In other words, the control logic 200 may control the parity generator 340 to generate a parity for data in which the error correction data and the write data WR_DATA received from the syndrome decoder 330 are merged.

According to an exemplary embodiment of the inventive concept, the parity generator 340 may receive the first write data and the second write data from the control logic 200. When the first write control signal is received from the control logic 200, the parity generator 340 may merge the first write data with first error correction data according to the data mask signal DM, and may generate a parity for the merged first write data and first error correction data. When the second write control signal is received from the control logic 200, the parity generator 340 may merge the second write data with second error correction data according to the data mask signal DM, and may generate a parity for the merged second write data and second error correction data.

In this case, the control logic 200 may receive from the external device the data mask signal DM, a first masked write signal MWR 1, and a second masked write signal MWR 2, and may control the ECC circuit 300 so that the first write data and the first error correction data are merged based on the data mask signal DM and the first masked write signal MWR 1, and the second write data and the second error correction data are merged based on the data mask signal DM and the second masked write signal MWR 2.

Accordingly, the parity generator 340 may generate the parity for the data obtained by merging the error correction data with the write data received from the syndrome decoder 330, and may write the data and the parity for the data in the memory bank having the corresponding address ADDR via the data control logic 210 based on the address ADDR of the memory bank received from the control logic 200.

On the other hand, the memory device 1000 according to an exemplary embodiment of the inventive concept may satisfy the formula, tCCDMW=N*tCCD, where tCCD is a column access strobe (CAS)-to-CAS command delay time, tCCDMW is the CAS-to-CAS command delay time in the read-modify-write operation, and N is a natural number. In other words, when the memory cell array 100 includes N memory banks, the CAS-to-CAS command delay time in the read-modify-write operation may be a value calculated by multiplying the CAS-to-CAS command delay time of the memory device 1000 by N.

In the masked write operation, the memory device 1000 according to an exemplary embodiment of the inventive concept may need a time of 1*tCCD for receiving data from the memory cell array 100, the time of 1*tCCD for correcting the error of the read data R_DATA, the time of 1*tCCD for correcting the error of the data in which the masked read data and the write data WR_DATA are merged, and the time of 1*tCCD for writing data in the memory cell array 100.

In this case, since the ECC circuit 300 according to an exemplary embodiment of the inventive concept separately includes the syndrome generator 310 and the syndrome decoder 330 which correct errors in the read data R_DATA, and the parity generator 340 correcting the error in the merged data, four memory banks included in the memory cell array 100 may share one ECC circuit 300 to perform the error correction together. In other words, the data read from the four memory banks may be processed in tCCD units separately by the syndrome generator 310, the latch circuit 320, the syndrome decoder 330, and the parity generator 340. Thus, the data of the four memory banks may be simultaneously processed in one ECC circuit 300.

In this case, the four memory banks may include the first memory bank 110, the second memory bank 120, a third memory bank, and a fourth memory bank, where the first memory bank 110 is arranged on a first side surface of the second memory bank 120, the ECC circuit 300 is arranged on a second side surface of the second memory bank 120 and on a first side surface of the third memory bank, and the fourth memory bank is arranged on a second side surface of the third memory bank. In this case, the first side surface may refer to an opposite side surface of the second side surface, and general elements for implementing memory devices such as input/output lines, sense amplifiers, column decoders, and row decoders may be included between respective configuration components.

However, this is merely an example embodiment, and it is evident that only two memory banks may share one ECC circuit 300.

On the other hand, according to an exemplary embodiment of the inventive concept, the syndrome generator 310 may receive the first read data R_DATA 1 included in the first memory bank 110 and generate a syndrome indicating that there is an error in the first read data R_DATA 1. In addition, the parity generator 340 may generate the parity for the first write data received from the control logic 200 while the syndrome generator 310 generates the syndrome for the first read data R_DATA 1, and may transmit the first write data and the generated parity to the second memory bank 120. In this case, the syndrome decoder 330 may correct the error included in the first read data R_DATA 1 based on a result of decoding the generated syndrome and the first read data R_DATA 1.

Thus, referring to FIG. 2, when the masked write operation is performed for each of the plurality of memory banks, the memory device 1000 according to an exemplary embodiment of the inventive concept may retain read data for a certain period of time, write new data corresponding to each memory bank together with existing data, and generate a parity to increase the speed and accuracy of the memory device 1000. In addition, even though the read operation and the write operation are simultaneously performed on the plurality of memory banks, the syndrome generation and parity generation operations may be simultaneously performed.

Figure 3:
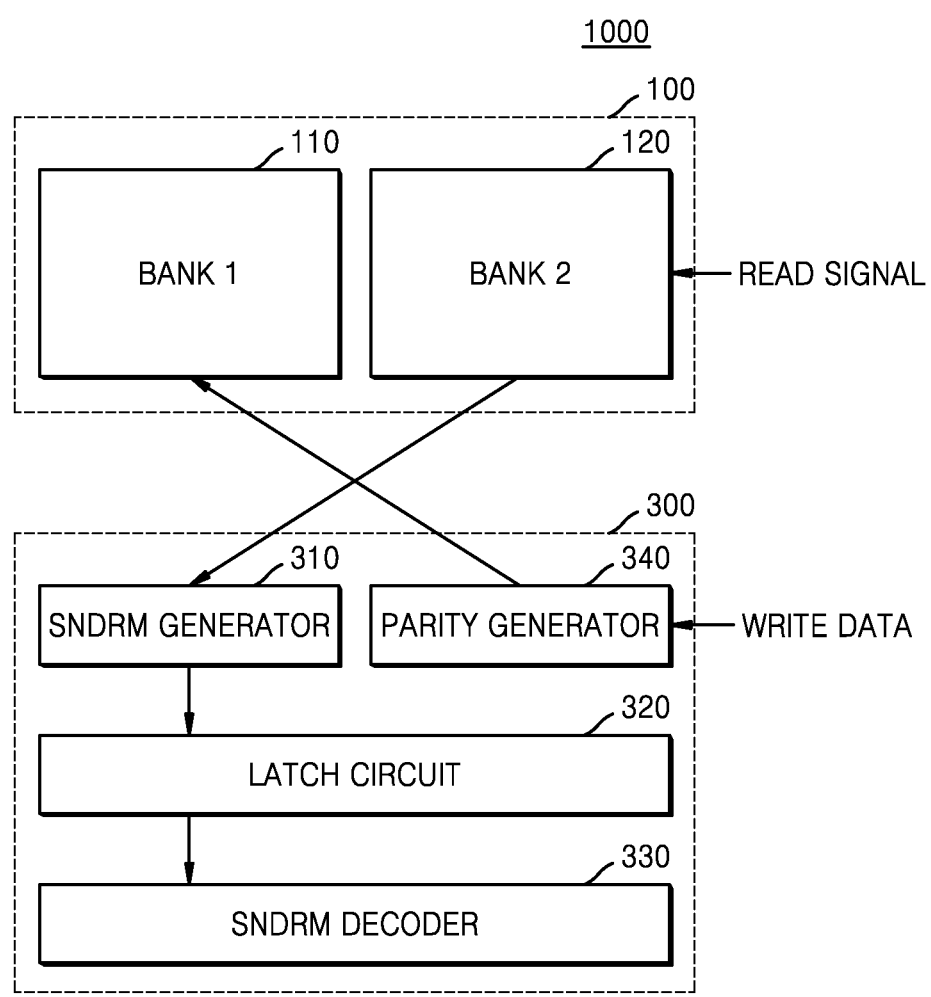
FIG. 3 is a block diagram illustrating the memory device of FIG. 1 in a case when a read command and a write command are applied according to an exemplary embodiment of the inventive concept.

FIG. 3 is a block diagram illustrating the memory device of FIG. 1 when a read command and a write command are applied according to an exemplary embodiment of the inventive concept.

According to an exemplary embodiment of the inventive concept, the memory device 1000 may write the write data WR_DATA and the parity therefor in the first memory bank 110 and correct the error by decoding the syndrome for the generated read data R_DATA, after having transmitted the read data R_DATA of the second memory bank 120 to the ECC circuit 300 to generate the syndrome and having received the write data WR_DATA from the control logic 200 to generate the parity for the write data WR_DATA.

The control logic 200 may apply a voltage to the memory cell array 100 to read the data of the second memory bank 120. On the other hand, the control logic 200 may transmit, to the ECC circuit 300, the write data WR_DATA to be written in the first memory bank 110 with a certain time difference thereafter.

Unlike a general ECC circuit, when the syndrome generator 310 and the parity generator 340 are provided as separate circuits, the ECC circuit 300 may generate the syndrome for the data read from the second memory bank 120 and at substantially the same time, may generate the parity for the data to be written in the first memory bank 110.

The syndrome generator 310 may generate the syndrome indicating the error of the read data R_DATA received from the second memory bank 120 and then transmit the generated syndrome to the latch circuit 320. When the latch circuit 320 receives a signal related to a simple read operation or a simple write operation other than the MWR operation from the control logic 200, the latch circuit 320 may directly transmit the output time of the received data to the syndrome decoder 330 without a delay. The syndrome decoder 330 may correct the received data for the error thereof and output the corrected received data to the outside of the memory device 1000. In addition, the parity generator 340 may generate the parity for the write data WR_DATA received from the data control logic 210. The write data WR_DATA and the generated parity may be written in the first memory bank 110 via the data control logic 210.

According to another embodiment of the inventive concept, when a time during which the syndrome generator 310 generates the syndrome for the received read data R_DATA and a time during which the parity generator 340 generates the parity at least partially overlap, the control logic 200 may individually control the syndrome generator 310 and the parity generator 340 in parallel.

According to an exemplary embodiment of the inventive concept, the control logic 200 may control the syndrome generator 310 and the parity generator 340 in parallel. The control logic 200 may determine whether the times during which the syndrome generator 310 and the parity generator 340 respectively generate the syndrome and the parity at least partially overlap, based on an internal command that the control logic 200 has issued and transmitted. In this case, the control logic 200 may separately transmit to the ECC circuit 300 a first control signal for controlling the syndrome generator 310, the latch circuit 320, and the syndrome decoder 330, and a second control signal for controlling the parity generator 340.

In other words, even when the first memory bank 110 and the second memory bank 120 respectively simultaneously perform the write operation and the read operation, it may be possible to improve a degree of integration of the memory device 1000 by performing the error correction with one ECC circuit 300 and reducing an area occupied by the ECC circuit 300. In addition, since errors occurring during the read or write operations of data for the plurality of memory banks may be simultaneously corrected, a processing speed may increase.

Figure 4:
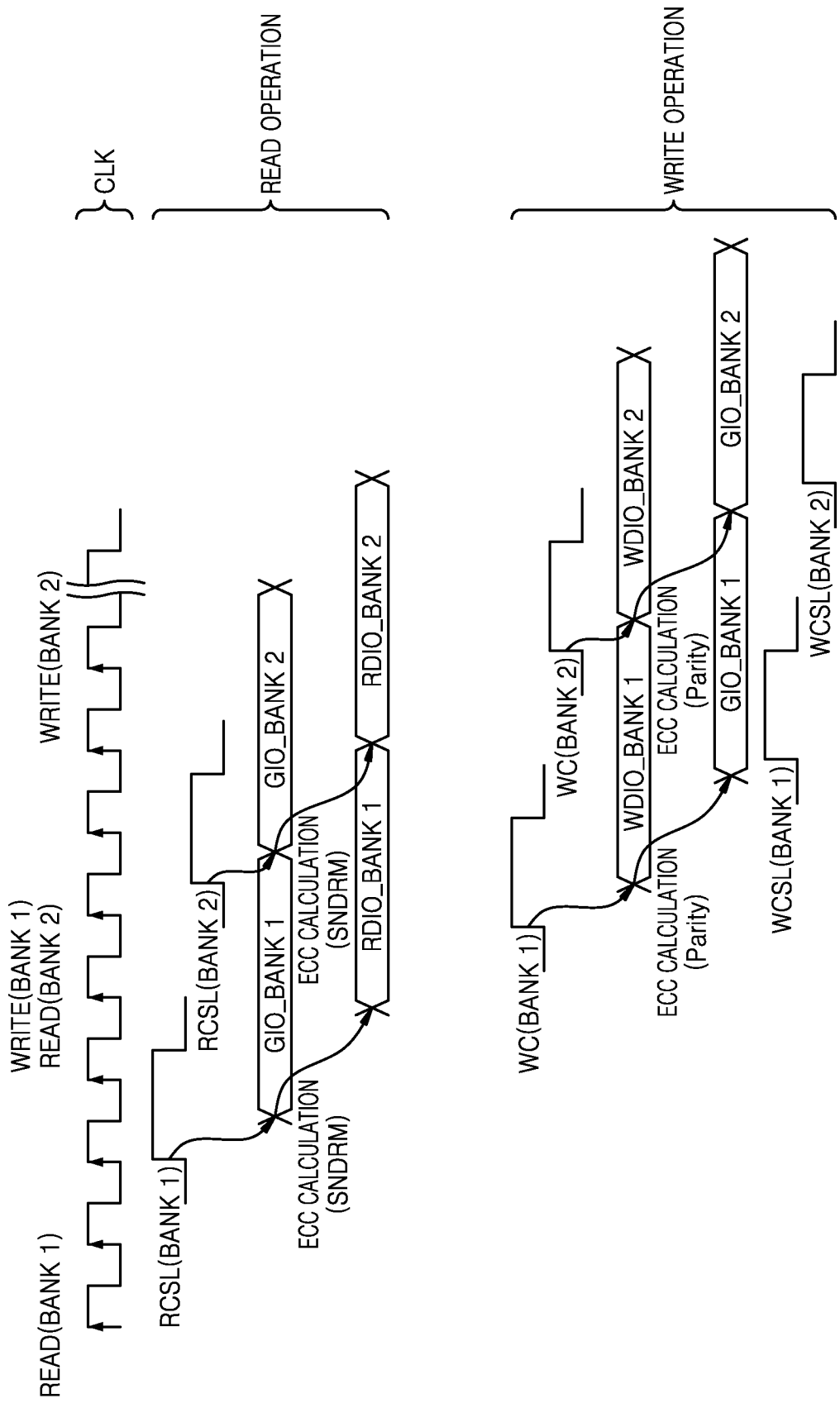
FIG. 4 is a data flow diagram in a case when the read command and the write command are applied according to an exemplary embodiment of the inventive concept.

FIG. 4 is a data flow diagram in a case when the read command and the write command are applied according to an exemplary embodiment of the inventive concept. Hereinafter, descriptions are given with reference to reference numerals in FIG. 3.

According to an exemplary embodiment of the inventive concept, the memory device 1000 may be supplied with commands for the read operation and the write operation of the first memory bank 110 and the second memory bank 120 from the external device. In this case, a first read command READ(BANK 1) and a second read command READ (BANK 2) and a first write command WRITE(BANK 1) and a second write command WRITE(BANK 2) may be applied to the memory device 1000.

The control logic 200 may apply a voltage to a certain bit line after applying a voltage to a certain word line of the memory cell array 100. When a voltage, e.g., a first read column selection line RCSL(BANK 1), is applied to a certain bit line, the first memory bank 110 may transmit first read data GIO_BANK1 to the ECC circuit 300 to perform an ECC calculation. Similarly, when the control logic 200 applies a voltage, e.g., a second read column selection line RCSL(BANK 2), to a bit line different from the certain bit line, the second memory bank 120 may transmit the second read data GIO_BANK2 to the ECC circuit 300.

The syndrome generator 310 may generate a syndrome for the first read data GIO_BANK1 received from the first memory bank 110, perform the error correction based on the syndrome, and transmit the generated syndrome to the latch circuit 320. As a signal for a simple read operation rather than a signal for the masked write is received, the latch circuit 320 may output error-corrected first read data RDIO_BANK1 to the outside of the memory device 1000.

Operations described above may be similarly performed on the second memory bank 120, and the latch circuit 320 may transmit error-corrected second read data RDIO_BANK2 received from the syndrome generator 310 to the outside of the memory device 1000.

Since the memory device 1000 according to an exemplary embodiment of the inventive concept includes the syndrome generator 310 and the parity generator 340 separate from each other, a parity calculation according to the write operation may be performed in the first memory bank 110 while the read operation is performed and a syndrome calculation is performed in the second memory bank 120. In other words, the parity calculation for data to be written in the first memory bank 110 may be performed at substantially the same time even while the syndrome calculation of the second memory bank 120 is performed.

The second read command READ(BANK 2) for the second memory bank 120 and the first write command WRITE(BANK 1) for the first memory bank 110 may be input with a small time difference or in the same time zone, from the external device to the memory device 1000. In this case, the syndrome generator 310, the latch circuit 320, and the syndrome decoder 330 may be used for correcting the error of the data in the second memory bank 120 and outputting the error-corrected data to the outside. At the same time, the parity generator 340 may be used to generate the parity for the data to be written in the first memory bank 110.

The control logic 200 may transmit a first write control signal WC(BANK 1) to the parity generator 340 based on the first write command WRITE(BANK 1) for the first memory bank 110. In addition, the control logic 200 may transmit the first write data to be written in the first memory bank 110 to the parity generator 340.

The parity generator 340 may generate the parity for the first write data based on the first write control signal WC(BANK 1). Similarly, for data to be written in the second memory bank 120, the parity for the second write data may be generated based on the second write control signal WC(BANK 2). Data in which the first write data and the parity therefor are included, e.g., WDIO_BANK1, and data in which the second write data and the parity therefor are included, e.g., WDIO_BANK2, may be transmitted to the memory cell array 100, and may be written in the first memory bank 110 and the second memory bank 120, respectively. In this case, data GIO_BANK1 to be written in the first memory bank 110 and data GIO_BANK2 to be written in the second memory bank 120 may be written in the first memory bank 110 and the second memory bank 120 depending on voltages WCSL(BANK 1) and WCSL(BANK 2) applied to the certain bit lines received from the control logic 200, respectively.

Accordingly, since the memory device 1000 may be provided with the parity generator 340 in parallel with the syndrome generator 310, the latch circuit 320, and the syndrome decoder 330 included in the ECC circuit 300, the memory device 1000 may perform the error correction on the data to be written in the first memory bank 110 even though the error correction on the data of the second memory bank 120 is being performed.

Figure 5:
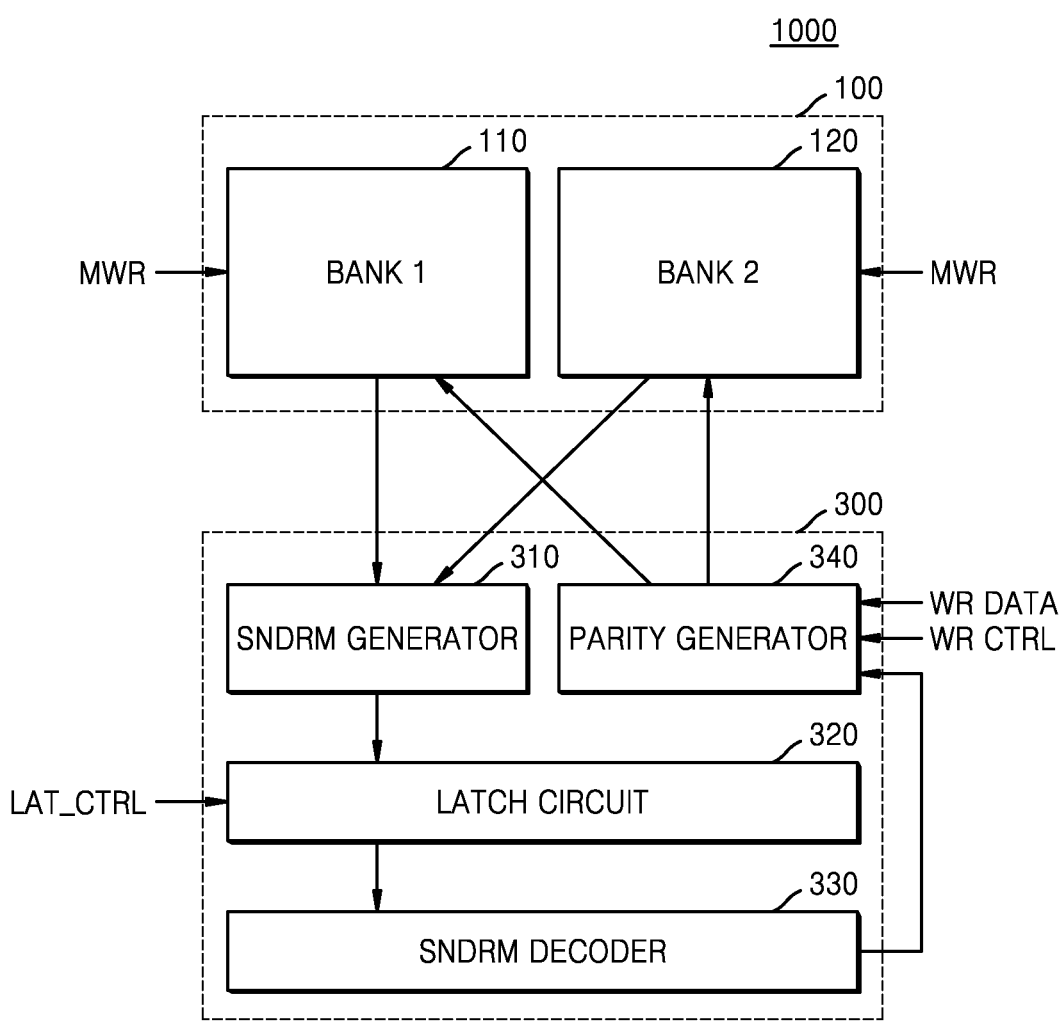
FIG. 5 is a block diagram illustrating the memory device of FIG. 1 in a case when a mask write command is applied according to an exemplary embodiment of the inventive concept.

FIG. 5 is a block diagram illustrating the memory device of FIG. 1 in a case when a mask write command is applied according to an exemplary embodiment of the inventive concept.

According to an exemplary embodiment of the inventive concept, different masked write operations performed on data included in each of the first memory bank 110 and the second memory bank 120 may be continuously performed at short time intervals. Accordingly, the control logic 200 may sequentially apply voltages to the first memory bank 110 and the second memory bank 120 to transmit the data included in the memory cell array 100 to the ECC circuit 300.

The memory cell array 100 may continuously transmit to the syndrome generator 310 the first read data included in the first memory bank 110 and the second read data included in the second memory bank 120. The syndrome generator 310 may generate the syndromes for each of the first read data and the second read data and sequentially transmit the generated syndromes to the latch circuit 320.

The latch circuit 320 may store for a certain time the first read data and the second read data for which the syndromes have been generated. In this case, when the latch control signal is received, the latch circuit 320 may sequentially transmit to the syndrome decoder 330 the first read data and the second read data which include the generated syndromes.

The syndrome decoder 330 may perform the error detection and the error correction based on decoded syndromes and output the first read data DIO_BANK 1 and the second read data DIO_BANK 2 in which the error detection and correction have been completed, and may transmit the first read data DIO_BANK1 and the second read data DIO_BANK2 to the parity generator 340.

The parity generator 340 may receive the first write control signal for performing the masked write operation on the first read data together with the first write data, which is new data required for the masked write operation of the first memory bank 110. In addition, the parity generator 340 may receive the second write control signal for performing the masked write operation on the second read data together with the second write data, which is new data required for the masked write operation of the second memory bank 120.

The parity generator 340 may merge the first write data with the first group data corresponding to the logic high of the data mask signal DM in the first read data DIO_BANK1 based on the first write control signal. Thereafter, the first parity for the merged data may be generated. In addition, the parity generator 340 may merge the second write data with the first group data corresponding to the logic high of the data mask signal DM in the second read data DIO_BANK2 based on the second write control signal. Thereafter, the second parity for the merged data may be generated. The parity generator 340 may transmit the data for which the parity has been generated to the data control logic 230, and the data control logic 230 may write the data in the first memory bank 110 and the second memory bank 120.

Figure 6:
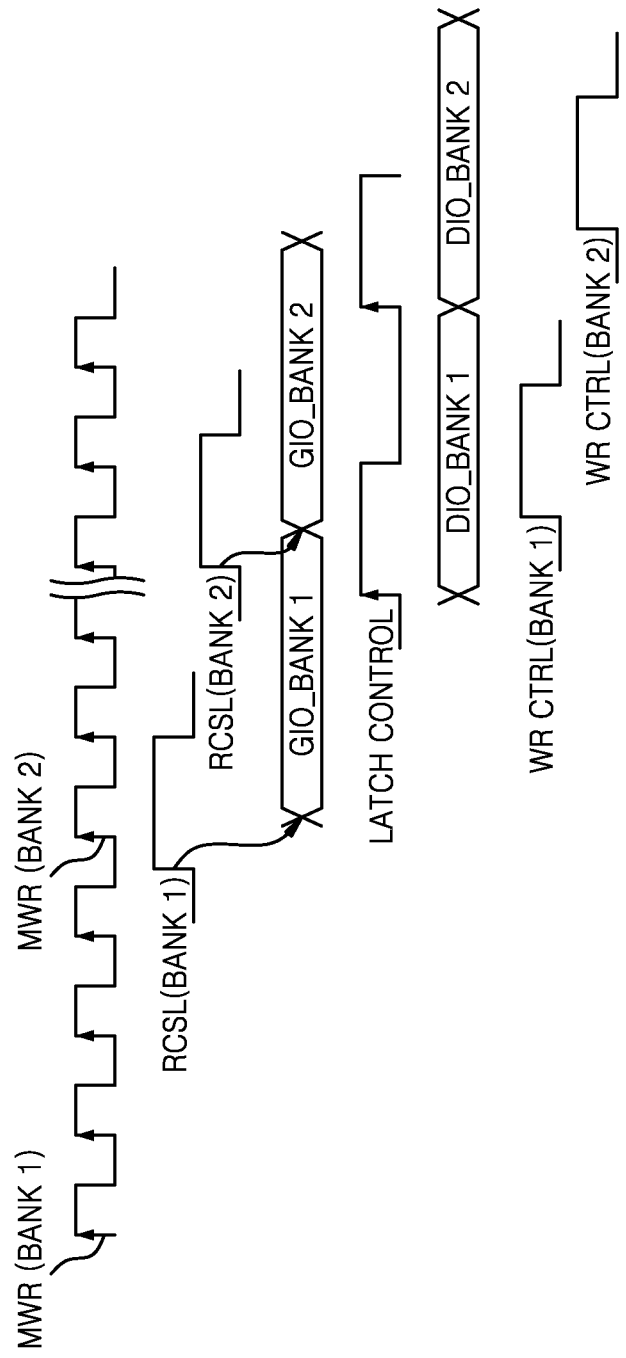
FIG. 6 is a data flow diagram in a case when the mask write command is applied according to an exemplary embodiment of the inventive concept.

FIG. 6 is a data flow diagram in a case when the masked write command is applied according to an exemplary embodiment of the inventive concept. Hereinafter, descriptions are given with reference to reference numerals in FIG. 5.

According to an exemplary embodiment of the inventive concept, the memory device 1000 may be supplied with commands for the masked write operation of the first memory bank 110 and the second memory bank 120 from the external device. In other words, the control logic 200 may receive a first MWR signal MWR(BANK1) for the first memory bank 110 from outside the memory device 1000.

The control logic 200 may perform the read-modify-write operation to the first memory bank 110 based on the first MWR signal MWR(BANK1). Accordingly, the control logic 200 may control the memory cell array 100 to transmit the first read data GIO_BANK1 of the first memory bank 110 to the syndrome generator 310 by applying a voltage, e.g., the first read column selection line RCSL(BANK 1) command, to a certain bit line.

Similarly, the control logic 200 may control the memory cell array 100 to transmit the second read data GIO_BANK2 of the second memory bank 120 to the syndrome generator 310 by applying a voltage, e.g., the second read column selection line RCSL(BANK 2) command, to a certain bit line.

The syndrome generator 310 may generate syndromes for the received first read data GIO_BANK1 and second read data GIO_BANK 2, respectively, and transmit the generated syndromes to the latch circuit 320 together with the received first read data GIO_BANK1 and second read data GIO_BANK 2.

The latch circuit 320 may retain the first read data GIO_BANK1 and the second read data GIO_BANK2 when the latch control signal is applied. When the latch control signal LAT_CTRL is applied to the latch circuit 320, the first read data GIO_BANK1 may be retained, and when the first write control signal WR CTRL(BANK 1) is applied, the latch circuit 320 may transmit retained first read data DIO_BANK1 to the syndrome decoder 330. In addition, when the latch control signal LAT_CTRL is applied to the latch circuit 320, the second read data GIO_BANK2 may be retained, and when the second write control signal WR CTRL(BANK 2) is applied, the latch circuit 320 may transmit retained second read data DIO_BANK2 to the syndrome decoder 330. At this time, the contents of received data, e.g., the first and second read data GIO_BANK1 and GIO_BANK 2, and the contents of transmitted data, e.g., the retained first and second read data DIO_BANK1 and DIO_BANK2, are the same.

In this case, when a signal for the masked write operation is applied from the outside, the control logic 200 may transmit the latch control signal LAT_CTRL to the latch circuit 320. At substantially the same time, when the first write control signal WR CTRL(BANK 1) is scheduled to be transmitted to the parity generator 340 between a time point when a voltage, e.g., the second read column selection line command RCSL(BANK 2), is applied to the second memory bank 120 and a time point when the second read data GIO_BANK2 is retained, the control logic 200 may transmit the latch control signal LAT_CTRL ahead of the first write control signal WR CTRL(BANK 1) to the latch circuit 320.

In detail, the control logic 200 may transmit the latch control signal LAT_CTRL based on a time point in which the first write control signal WR CTRL(BANK 1) is applied. In other words, the control logic 200 may transmit the latch control signal LAT_CTRL at a time point calculated by subtracting a value equal to M times a clock signal period from the time point in which the first write control signal WR CTRL(BANK 1) is applied. M may be a natural number. Additionally, when the memory device 1000 satisfies the formula, tCCDMW=4*tCCD, the control logic 200 may transmit the latch control signal at a time point calculated by subtracting a value equal to 2*tCCD, which is a half of 4*tCCD, from the time point in which the first write control signal WR CTRL(BANK 1) is applied.

This above-described arrangement is to generate a parity by merging first write data with first read data without generating a parity by merging the first write data with second read data.

According to an exemplary embodiment of the inventive concept, when the first write control signal WR CTRL (BANK 1) is not received by the latch circuit 320 while the first read data GIO_BANK1 is retained in the latch circuit 320, the control logic 200 may transmit the latch control signal LAT_CTRL to the latch circuit 320 and retain the first read data GIO_BANK1 and the second read data GIO_BANK 2.

The syndrome decoder 330 may receive the first read data DIO_BANK1 and the second read data DIO_BANK 2, perform the error detection and the error correction based on the decoded syndrome, and then, transmit a result of the error detection and the error correction to the parity generator 340.

The parity generator 340 may perform the masked write operation to merge the first write data with the first read data R_DATA 1 corresponding to the logic low of the data mask signal DM based on the first write control signal WR CTRL(BANK 1).

Similarly, the parity generator 340 may perform the masked write operation to merge the second write data with the second read data R_DATA 2 corresponding to the logic low of the data mask signal DM based on the second write control signal WR CTRL(BANK 2).

Figure 7:
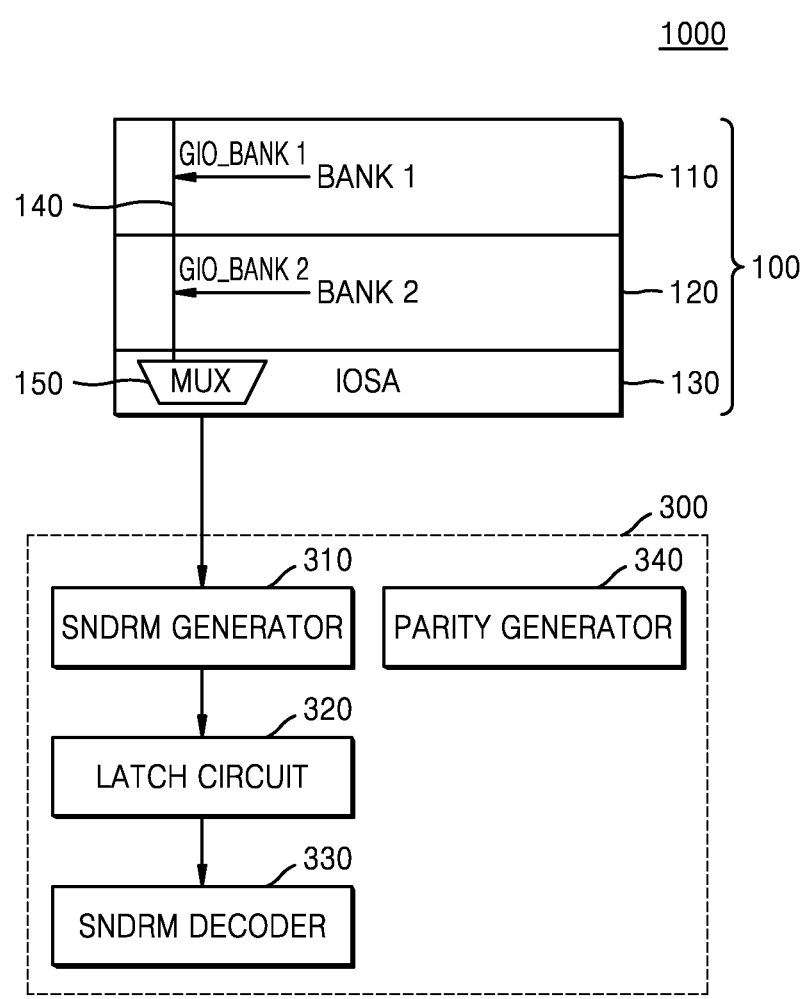
FIG. 7 is a block diagram illustrating the memory device of FIG. 1 including a global input/output (GIO) line corresponding to a plurality of banks according to an exemplary embodiment of the inventive concept.

FIG. 7 is a block diagram illustrating the memory device of FIG. 1 including a GIO line corresponding to a plurality of banks according to an exemplary embodiment of the inventive concept.

Referring to FIG. 7, the memory device 1000 may include the memory cell array 100 and the ECC circuit 300. The memory cell array 100 may include the first memory bank 110, the second memory bank 120, an input/output sense amplifier (IOSA) 130, a GIO line 140, and a multiplexer (MUX) 150. Configurations of the memory cell array 100 and the ECC circuit 300 are substantially the same as those described above, and thus are omitted.

The first memory bank 110 and the second memory bank 120 may transmit the first read data and the second read data, respectively, to the ECC circuit 300 via the GIO line 140.

The GIO line 140 may be configured to include a plurality of input/output lines. For example, the GIO line 140 may include a first GIO line connected from the first memory bank 110 to the IOSA 130 and a second GIO line connected from the second memory bank 120 to the IOSA 130.

The IOSA 130 may receive the first read data GIO_BANK1 of the first memory bank 110 and the second read data GIO_BANK2 of the second memory bank 120, from the GIO line 140. In this case, the MUX 150 included in the IOSA 130 may sequentially transmit the first read data GIO_BANK1 and the second read data GIO_BANK2 to the ECC circuit 300.

As an example, the MUX 150 may first transmit to the ECC circuit 300 data that is received first among the first read data GIO_BANK1 and the second read data GIO_BANK2. In this case, the control logic 200 may control time points for outputting the first read data GIO_BANK1 and the second read data GIO_BANK2 to match an error correction timing of the ECC circuit 300.

The ECC circuit 300 may perform the ECC calculation on the first read data GIO_BANK1 and the second read data GIO_BANK2 that have been sequentially output from the MUX 150. The detailed operation of the ECC circuit 300 is substantially the same as that described above, and thus is omitted.

Figure 8:
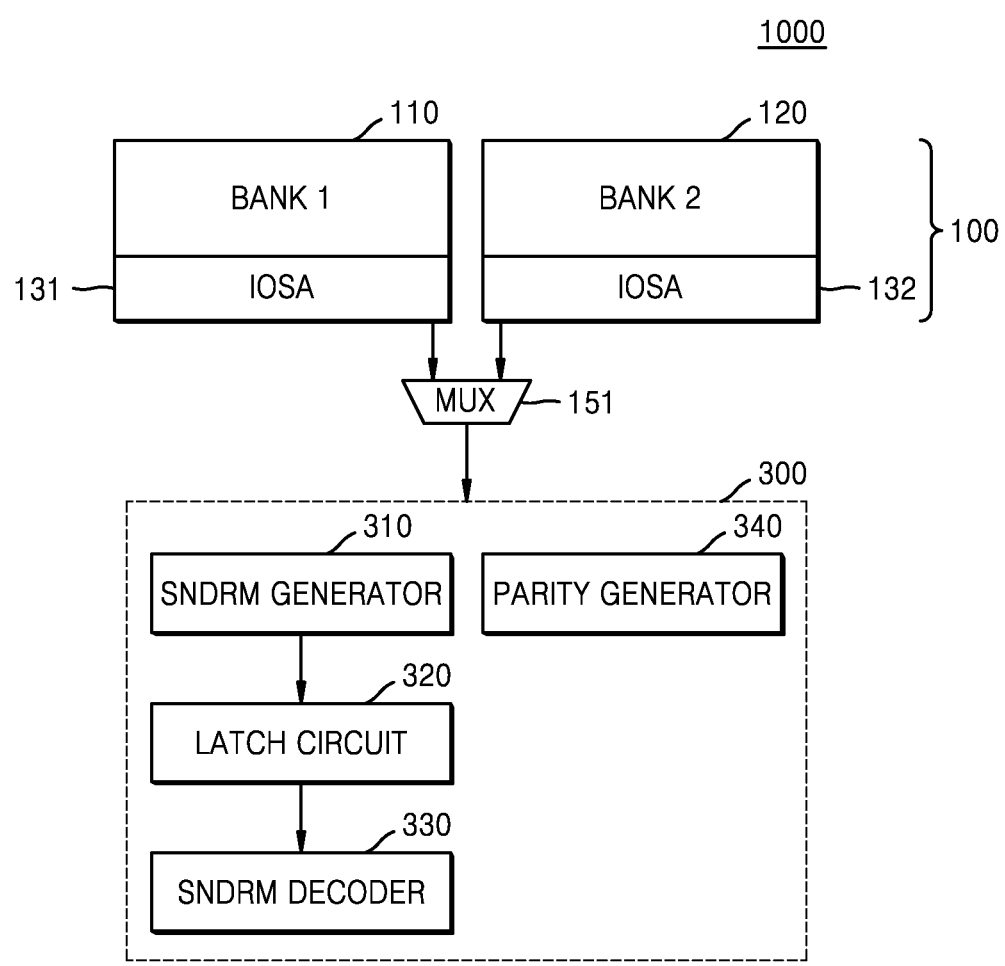
FIG. 8 is a block diagram illustrating the memory device of FIG. 1 including an input/output (IO) line at each of a plurality of memory banks according to an exemplary embodiment of the inventive concept.

FIG. 8 is a block diagram illustrating the memory device of FIG. 1 including an input/output (10) line at each of a plurality of memory banks according to an exemplary embodiment of the inventive concept.

Referring to FIG. 8, the memory device 1000 may include the memory cell array 100 and the ECC circuit 300. The memory cell array 100 may include the first memory bank 110, the second memory bank 120, a first IOSA 131, a second IOSA 132, and a MUX 151.

According to an exemplary embodiment of the inventive concept, the first memory bank 110 may output first read data via the first IOSA 131, and the second memory bank 120 may output second read data via the second IOSA 132. The MUX 151 may sequentially transmit the first read data and the second read data to the ECC circuit 300.

As an example, the control logic 200 may control the MUX 151 to sequentially transmit the first read data and the second read data to the ECC circuit 300. As another example, the MUX 151 may first transmit to the ECC circuit 300 data that is first received among the first read data and the second read data.

The ECC circuit 300 may perform the ECC calculation on the first read data and the second read data that have been output from the MUX 150. The detailed operation of the ECC circuit 300 is substantially the same as that described above, and thus is omitted.

Figure 9:
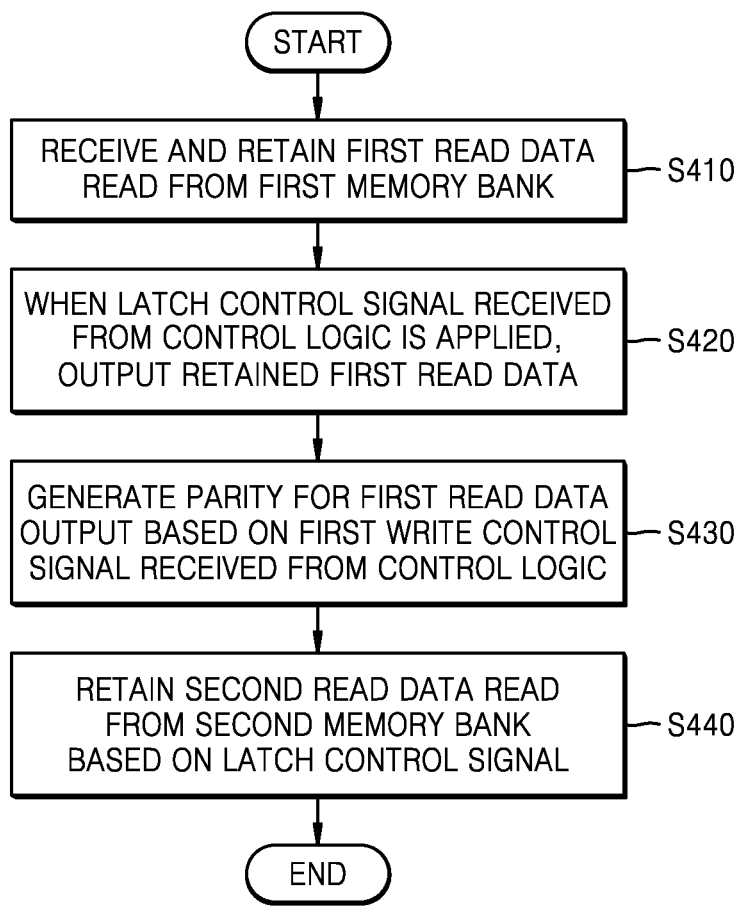
FIG. 9 is a flowchart of an operating method of the memory device of FIG. 1 according to an exemplary embodiment of the inventive concept.

FIG. 9 is a flowchart of an operating method of the memory device of FIG. 1 according to an exemplary embodiment of the inventive concept.

The memory device 1000 may receive and retain first read data read from the first memory bank 110 (S410). In this case, the first data read from the first memory bank 110 may be retained based on the latch control signal LAT_CTRL.

The memory device 1000 may output the retained first read data when the latch control signal LAT_CTRL is applied (S420). The first read data may be output based on the latch control signal LAT_CTRL received from the control logic 200 when the first read data has been retained, and then a first write control signal is applied after the latch control signal has been applied.

The memory device 1000 may generate the parity for the first read data output from the latch circuit 320 based on the first write control signal received from the control logic 200 (S430). Particularly, the first parity may be generated from the first read data output from the latch circuit 320 and the first write data corresponding to the first MWR command.

The memory device 1000 may retain second read data read from the second memory bank 120 based on the latch control signal LAT_CTRL (S440). In other words, the latch circuit 320 may receive the second read data, and when the latch control signal LAT_CTRL is not applied, may retain the second read data without outputting the second read data.

Figure 10:
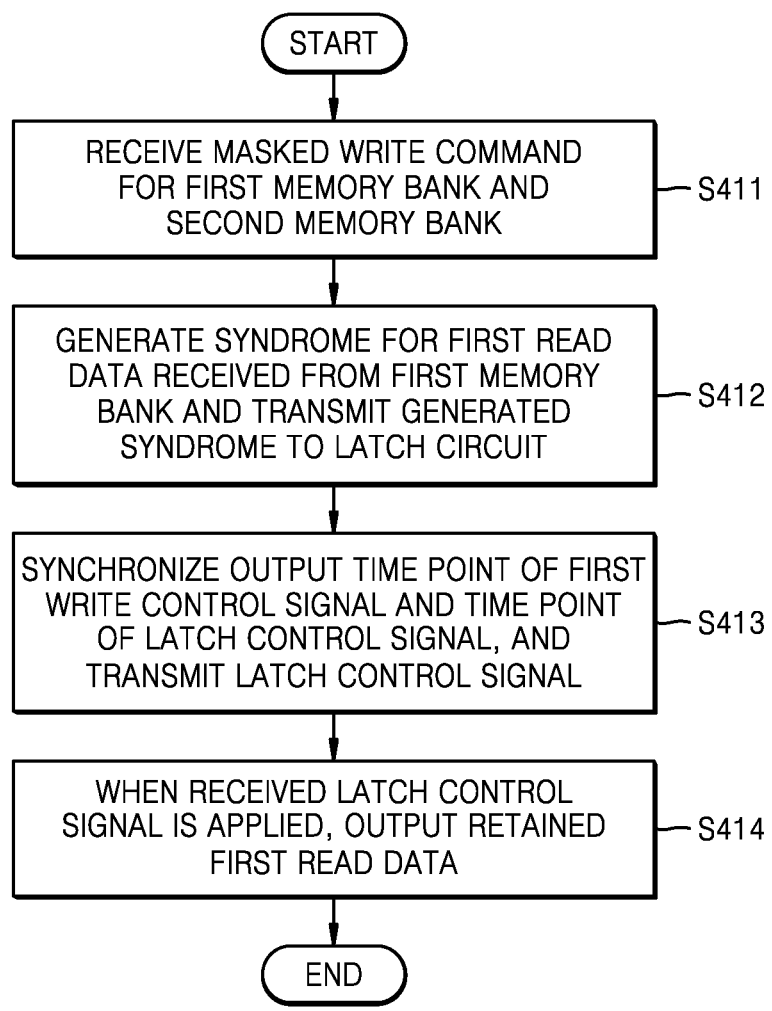
FIG. 10 is a detailed flowchart of an operating method of the memory device of FIG. 1 according to an exemplary embodiment of the inventive concept.

FIG. 10 is a detailed flowchart of an operating method of the memory device of FIG. 1 according to an exemplary embodiment of the inventive concept.

Referring to FIG. 10, the masked write command for the first memory bank 110 and the second memory bank 120 may be received (S411). In this case, the first mask write command may be a command for performing the masked write operation on data of the first memory bank 110, and the second mask write command may be a command for performing the masked write operation on data of the second memory bank 120.

A syndrome for first read data received from the first memory bank 110 may be generated and transmitted to the latch circuit 320 (S412). The latch circuit 320 may retain data received from the first memory bank 110 until the latch control signal LAT_CTRL is applied.

The latch control signal LAT_CTRL may be transmitted after the output time of the first write control signal and the output time of the latch control signal LAT_CTRL are synchronized (S413). Here, synchronization may indicate that the latch control signal LAT_CTRL is output at a time point earlier than a time point at which the first write control signal is scheduled to be output, so that the latch control signal LAT_CTRL is output at a time point corresponding to the first write control signal. The latch control signal LAT_CTRL may include a value obtained by subtracting a time corresponding to M times the clock signal period of the memory device 1000 from the output time point of the first write control signal. Alternatively, when the formula, tCCDMW=N*tCCD, is satisfied, the latch control signal LAT_CTRL may include a value obtained by subtracting a time corresponding to N/2*tCCD.

When the received latch control signal LAT_CTRL is applied to the latch circuit 320, the retained first read data may be output (S414). The latch circuit 320 may output the first read data to the syndrome decoder 330 to perform the error correction on the data.

Figure 11:
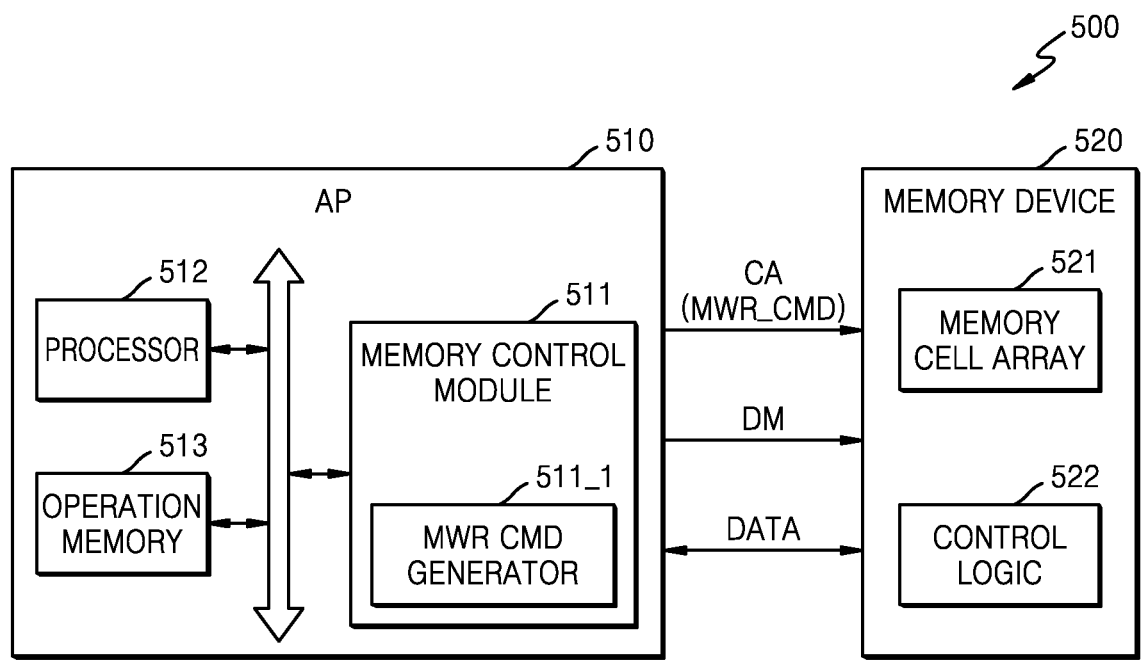
FIG. 11 is a block diagram illustrating a data processing system according to an exemplary embodiment of the inventive concept.

FIG. 11 is a block diagram illustrating a data processing system according to an exemplary embodiment of the inventive concept.

FIG. 11 illustrates a data processing system 500 including an application processor 510 and a memory device 520. A memory control module 511 in the application processor 510 and the memory device 520 may constitute a memory system. In addition, the memory control module 511 may include an MWR command generator 511_1, and the memory device 520 may include a memory cell array 521 and a control logic 522. The control logic 522 according to the exemplary embodiments described above may correct errors of the data read from the plurality of memory banks in response to the masked write command MWR_CMD and the data mask signal DM from the memory control module 511, and may write the data, having the errors corrected, in the memory cell array 521.

The application processor 510 may be implemented as a system on chip (SoC). The SoC may include a system bus to which a protocol having a certain standard bus specification is applied, and may include various intellectual properties (IP) related to the system bus. As an example of a standard specification of the system bus, an advanced microcontroller bus architecture (AMBA) protocol of the Advanced RISC Machine (ARM), Ltd. may be applied. A bus type of the AMBA protocol may include advanced high-performance bus (AHB), advanced peripheral bus (APB), advanced extensible interface (AXI), AXI4, AXI coherency extensions (ACE), or the like. In addition, other types of protocols may also be applied, such as uNetwork of SONICs Inc., CoreConnect of IBM Corporation, or open core protocol of Open Core Protocol International Partnership (OCP-IP).

The application processor 510 may further include a processor 512 and an operation memory 513, which are connected via the system bus. The processor 512 may control various operations within the application processor 510 and may control, for example, the memory control module 511 to access the memory device 520. In addition, the processor 512 may control various operations by using software, and the operation memory 513 may store programs for the control operations.

The masked write operation in the above-described exemplary embodiments may be performed as determined by the memory control module 511. For example, regardless of the control of the processor 512, the memory control module 511 may determine a need to perform the masked write operation and provide the masked write command MWR_CMD to the memory device 520 depending on a result of the determination.

While the inventive concept has been shown and described above with reference to exemplary embodiments thereof, it will be apparent to those of ordinary skill in the art that modifications and variations in form and details may be made thereto without departing from the spirit and scope of the inventive concept as set forth by the following claims.

What is claimed is:

1. A memory device, comprising:
a memory cell array comprising a first memory bank and a second memory bank;
a control logic configured to receive a command from the outside and control an internal operation of the memory device in response to the received command; and
an error correction code (ECC) circuit shared by the first memory bank and the second memory bank, configured to:
retain in a latch circuit the first read data read from the first memory bank in response to a first masked write (MWR) command for the first memory bank based on a latch control signal from the control logic;
delay a retain time for which the first read data is retained in the latch circuit based on the latch control signal;
generate a first parity from data in which the first read data retained in the latch circuit for the retain time is merged with first write data corresponding to the first MWR command in response to a first write control signal received from the control logic; and
control an ECC operation to retain in the latch circuit the second read data read from the second memory bank based on the latch control signal in response to the second masked write (MWR) command that is received after the first masked write (MWR) command, after the first parity has been generated.

2. The memory device of claim 1, wherein the ECC circuit is configured to generate a second parity by using the second read data in response to a second write control signal received from the control logic, and the latch circuit is configured to retain the first read data and the second read data in response to receiving the latch control signal, and output the retained data to generate parities of the first read data and the second read data.

3. The memory device of claim 2, wherein the ECC circuit is configured to correct an error of the first read data in response to receiving the first write control signal, and merge the error-corrected first read data with the first write data.

4. The memory device of claim 2, wherein the second read data is data read in response to a second MWR command for the second memory bank,
the control logic is configured to further receive data masking (DM) signals respectively corresponding to the first and second MWR commands,
the first parity is a parity generated by using data in which the first write data is merged with error-corrected first read data, and
the second parity is a parity generated by using data in which the second write data is merged with error-corrected second read data.

5. The memory device of claim 1, wherein the control logic is configured to transmit to the ECC circuit the latch control signal at a time point calculated by subtracting a value equal to M times a clock signal period of the memory device from a time point in which the first write control signal is transmitted, where M is a natural number.

6. The memory device of claim 1, wherein the first memory bank and the second memory bank are configured to transmit the first read data and the second read data to the ECC circuit via a first global input/output (GIO) line and a second GIO line, respectively.

7. The memory device of claim 6, wherein the memory cell array further comprises an input/output sense amplifier, and the input/output sense amplifier is configured to transmit to the ECC circuit the first read data and the second read data in response to receiving the first read data and the second read data via the first and second GIO lines, respectively.

8. The memory device of claim 1, further comprising a multiplexer (MUX) configured to transmit sequentially to the ECC circuit the first read data received from a first input/output sense amplifier corresponding to the first memory bank and the second read data received from a second input/output sense amplifier corresponding to the second memory bank.

9. The memory device of claim 1, wherein, when the formula, tCCDMW=N*tCCD, in which tCCDMW is a column access strobe (CAS)-to-CAS command delay time in a read-modify-write operation, tCCD is the CAS-to-CAS command delay time, and N is a natural number, is satisfied, N/2 memory banks share the ECC circuit.

10. The memory device of claim 9, wherein N is 4, and
an operation of continuously receiving the first read data and the second read data, an operation of correcting errors of the first read data and the second read data, an operation of generating a parity for the first read data and a parity for the second read data, and an operation of writing the first read data and the second read data respectively comprising the generated parities in the first memory bank and the second memory bank are individually performed during tCCD.

11. The memory device of claim 1, wherein the memory cell array comprises a third memory bank and a fourth memory bank,
the first memory bank is arranged on a first side surface of the second memory bank,
the ECC circuit is arranged on a second side surface of the second memory bank and on a first side surface of the third memory bank,
the fourth memory bank is arranged on a second side surface of the third memory bank,
the second side surface of the second memory bank is opposite the first side surface of the second memory bank, and
the second side surface of the third memory bank is opposite the first side surface of the third memory bank.

12. The memory device of claim 1, wherein, in response to not receiving the first write control signal in the ECC circuit while the first read data is retained in the ECC circuit, the control logic is configured to transmit the latch control signal to the ECC circuit to retain the first read data and the second read data.

13. A memory device comprising:
a memory cell array including a first memory bank and a second memory bank;
a control logic configured to receive a write command for the first memory bank and a read command for the second memory bank from the outside and control an internal operation of the memory device in response to the received write command and read command; and
an error correction code (ECC) circuit shared by the first memory bank and the second memory bank, configured to correct an error included in data,
wherein the ECC circuit comprises:
a syndrome generator configured to receive first read data read from the first memory bank and generate a syndrome indicating that there is an error in the first read data;
a parity generator configured to generate a parity for first write data received from the control logic while the syndrome generator generates the syndrome for the first read data, and transmit the first write data and the parity for the received first write data to the second memory bank; and
a syndrome decoder configured to correct an error included in the first read data by decoding the generated syndrome.

14. The memory device of claim 13, wherein the control logic is configured to control the syndrome generator and the parity generator in parallel when a time during which the syndrome generator generates the syndrome and a time during which the parity generator generates the parity at least partially overlap.

15. The memory device of claim 13, wherein the first memory bank and the second memory bank are configured to transmit the first read data and second read data to the ECC circuit via a first global input/output (GIO) line and a second GIO line, respectively.

16. The memory device of claim 15, further comprising a sense amplifier configured to transmit the first read data and the second read data to the ECC circuit in response to receiving the first read data and the second read data via the first GIO line and the second GIO line, respectively.

17. The memory device of claim 13, further comprising a multiplexer (MUX) configured to transmit to the ECC circuit the first read data received from a first sense amplifier corresponding to the first memory bank and the second read data received from a second sense amplifier corresponding to the second memory bank.

18. An operating method of a memory device, the memory device associated with a memory cell array comprising a first memory bank and a second memory bank, the first memory bank and the second memory bank sharing an error correction circuit, the operating method comprising:
receiving first read data read from the first memory bank and retaining the first read data in response to the first masked write (MWR) command based on a latch control signal received from a control logic;
delaying a retain time for which the first read data is retained in the latch circuit based on the latch control signal;
outputting the retained first read data within the retain time in response to a first write control signal received from the control logic after the latch control signal is received;
generating a first parity from data in which the first read data is merged with first write data corresponding to the first masked write (MWR) command in response to the first write control signal; and
retaining second read data read from the second memory bank in response to the second masked write (MWR) command based on the latch control signal.

19. The operating method of claim 18, wherein the generating comprises generating a second parity by using the second read data in response to a second write control signal received from the control logic, and
the retaining comprises retaining the first read data and the second read data in response to receiving the latch control signal, and outputting the first read data and the second read data to generate parities for the first read data and the second read data, respectively.

20. The operating method of claim 19, wherein, in response to receiving the first write control signal, the generating of the second parity comprises correcting an error of the first read data and merging the error-corrected first read data with the first write data.

* * * * *